(12) United States Patent
Kwon et al.

(10) Patent No.: US 6,768,690 B2
(45) Date of Patent: Jul. 27, 2004

(54) REGISTER CONTROLLED DLL FOR REDUCING CURRENT CONSUMPTION

(75) Inventors: Ki-Seop Kwon, Ichon (KR); Seong-Hoon Lee, Ichon (KR)

(73) Assignee: Hynix Semiconductor Inc., Kyoungki-do (KR)

(*) Notice: Subject to any disclaimer, the term of this patent is extended or adjusted under 35 U.S.C. 154(b) by 118 days.

(21) Appl. No.: 10/183,666

(22) Filed: Jun. 28, 2002

(65) Prior Publication Data

US 2003/0002357 A1 Jan. 2, 2003

(30) Foreign Application Priority Data

Jun. 30, 2001 (KR) .......................... 2001-38872

(51) Int. Cl.[7] .................................................. G11C 7/00
(52) U.S. Cl. .................. 365/194; 365/194; 365/189.12
(58) Field of Search ............... 365/194, 189.12, 365/189.05, 193, 233, 203, 230.08, 191

(56) References Cited

U.S. PATENT DOCUMENTS

| | | | |
|---|---|---|---|
| 5,337,285 A | 8/1994 | Ware et al. | |
| 5,440,514 A | 8/1995 | Flannagan et al. | |
| 5,440,515 A | 8/1995 | Chang et al. | |
| 5,610,543 A | 3/1997 | Chang et al. | |
| 5,740,115 A | 4/1998 | Ishibashi et al. | |
| 5,920,510 A | 7/1999 | Yukutake et al. | |
| 5,995,441 A | 11/1999 | Kato et al. | |
| 6,026,051 A | 2/2000 | Keeth et al. | |
| 6,031,788 A | 2/2000 | Bando et al. | |
| 6,147,527 A | 11/2000 | Lee et al. | |
| 6,178,123 B1 | 1/2001 | Kato et al. | |
| 6,215,726 B1 * | 4/2001 | Kubo | 365/233 |
| 6,266,283 B1 * | 7/2001 | Fujimori | 365/189.05 |

FOREIGN PATENT DOCUMENTS

| | | |
|---|---|---|
| JP | 7-176196 A | 7/1995 |
| JP | 9-17179 A | 1/1997 |
| JP | 10-171774 A | 6/1998 |
| JP | 10-275465 A | 10/1998 |
| JP | 11-202969 A | 7/1999 |
| JP | 11-219587 A | 8/1999 |
| JP | 11-306757 A | 11/1999 |
| JP | 2000-76852 A | 3/2000 |
| KR | 1020010004252 A | 1/2001 |
| KR | 2001-0027123 A | 4/2001 |

* cited by examiner

*Primary Examiner*—David Nelms
*Assistant Examiner*—Thinh T. Nguyen
(74) *Attorney, Agent, or Firm*—Birch, Stewart, Kolasch & Birch, LLP

(57) ABSTRACT

A resister controlled delay locked loop (DLL) is provided which is capable of reducing current consumption by operating the DLL loop when the semiconductor device is only at an operation mode. A semiconductor device having the register controlled DLL and an internal circuit synchronized with a DLL clock signal output from the register controlled DLL, includes an enable signal generator generating an enable signal for the register controlled DLL to control a generation of the DLL clock signal in response to an activation or non-activation signal of the semiconductor device.

11 Claims, 8 Drawing Sheets

REGISTER CONTROLLED DLL FOR REDUCING CURRENT CONSUMPTION

The application claims, under 35 U.S.C. §119, the priority benefit of Korean Patent Application No. 2001-38872 filed Jun. 30, 2001, the contents of which are herein fully incorporated by reference.

BACKGROUND OF THE INVENTION

1. Field of the Invention

The present invention relates to a delay locked loop (DLL) in a semiconductor memory device and, more particularly, to a resister controlled DLL capable of reducing current consumption by operating the DLL loop when the semiconductor device is only at an operation mode.

2. Discussion of the Related Art

Generally, in system circuits of semiconductor devices, a clock signal has been used as a reference signal for adjusting operation timing or guaranteeing a high-speed operation without an error. When a clock signal from an external circuit is used in an internal circuit, a time delay (or clock skew) is generated. A DLL has been used to compensate for such a time delay by providing the same phase between the external and internal clock signals. As compared with the phase locked loop (PLL), the DLL has an advantage in that it is less sensitive to a noise than the PLL. Accordingly, the DLL has been widely used in synchronous memories such as DDR SDRAMs (Double Data Rate Synchronous DRAMs). A register controlled DLL has been generally used as a DLL circuit.

Referring to FIG. 1, a conventional register controlled DLL includes first and second clock buffers 11 and 12, a clock divider 13, a phase comparator 19, a delay unit 10 which has first to third delay lines 14 to 16, a delay monitor 23 having a shift register 17 and a shift controller 18 in a DLL loop, first and second DLL drivers 20 and 21, and a delay model 22.

The first clock buffer 11 receives an inverted external clock signal/clk and produces a first clock signal fall_clk synchronized with a falling edge of the clock signal/clk. Likewise, the second clock buffer 12 receives the external clock signal clk and produces a second clock signal rise_clk synchronized with a rising edge of the clock signal clk. The clock divider 13 divides the second clock signal rise_clk into n signals (n: a positive integer, e.g., n=8) and then produces a reference signal ref and divided clock signals div_in.

The first delay line 14 in the delay unit 10 receives the first clock signal fall_clk according to an amount of delay from the shift register 17, which is controlled by the shift controller 18, and produces a first internal clock signal ifclk. Also, the second delay line 15 receives the second clock signal rise_clk according to an amount of delay from the shift register 17, which is also controlled by the shift controller 18, and produces a second internal clock signal irclk. The first and second DLL drivers 20 and 21 receive the first and second internal clock signals ifclk and irclk and produce first and second DLL clock signals fclk_dll and rclk_dll, respectively. The third delay line 16 receives the divided clock signal div_in from the clock divider 13 and produces a delayed clock signal feedback_dly. The delay model 22 receiving the delayed clock signal feedback_dly provides the same signal processing path to the delayed clock signal feedback_dly as the actual signal processing path.

The phase comparator 19 compares the phases of the output signal (feed_back) from the delay model 22 with the reference signal ref and provides a control signal ctrl to the shift controller 18 according to the phase difference. The shift controller 18 outputs a shift right or left signal SR or SL to the a shift register 17 in response to the control signal ctrl, and the first to third delay lines 14 to 16 shift the input clock signals (e.g., fall_clk, rise_clk and div_in) based on the amount of shifting stored in the shift register 17. Also, the shift controller 18 outputs a DLL locking signal dll_lockb when there is no phase difference between the output signal from the delay model 22 and the reference signal ref. The delay model 22 includes a dummy clock buffer, a dummy output buffer and a dummy load, which is called a replica circuit. The shift register 17 and the shift controller 18 form the delay monitor 23 used to control the first to third delay lines 14 to 16 within the delay unit 10.

The DLL operation of the device shown in FIG. 1 will be described in detail below. The first clock buffer 11 receiving the inverted external clock signal/clk from an external circuit produces the first clock signal fall_clk, and the second clock buffer 12 receiving the external clock clk produces the second clock signal rise_clk. The clock divider 13 produces n clock signals in response to the second clock signal rise_clk, thereby forming the reference clock signal ref and the divided clock signal div_in which are synchronized with the external clock signal clk every n divided clock signals.

At the initial operation, the divided clock signal div_in passes through the third delay line 16 in the delay unit 10, thereby forming the delayed clock signal feedback_dly, and the delayed clock signal feedback_dly is delayed in the delay model 22 to form another delayed clock signal (another feedback signal).

The phase comparator 19 compares the rising edge of the reference signal ref with that of the feedback signal feed_back and thereby produces the control signal ctrl. The shift controller 18 produces shift control signals SR and SL, each of which determines the right or left shift for the shift register 17, in response to the control signal ctrl from the phase comparator 19. Also, the shift register 17 determines the amount of the right or left shifting needed in the first to third delay lines 14–16 of the delay unit 10 in response to the shift control signals SR and SL. By comparing the delayed feedback signal feed_back with the reference signal ref on the DLL feedback loop, a delay locking is achieved at the time when a minimum jitter is present between the compared signals where the delay locking signal dll_lockb is produced as a signal notifying such a locking.

Once the phase locking is achieved, the DLL clock is continuously toggled, except for refresh and power-down modes, as shown in FIG. 2. For example, the DLL clock is toggled during the write, precharge or read operations. In FIG. 2, "ACT," WT," "PRE" and "RD" denote active, write, precharge and read commands, respectively. Accordingly, this continuous toggling of the DLL clock increases power consumption and, specifically, this power consumption is much higher at high frequency operations.

On the other hand, in peripheral circuits of the semiconductor memory devices, a multistage repeater 1 as shown in FIG. 3 is generally employed in order to maintain a slope or shape of the clock signal. However, since the size of the repeater 1 is relatively large, a large amount of current is consumed by the repeater 1. Typically, ten repeaters require or consume 10 mA amount of current. Accordingly, when the DLL clock signal is continuously toggled, the current consumption of the peripheral circuits increases significantly.

SUMMARY OF THE INVENTION

It is, therefore, an object of the present invention to provide a register control delay locked loop capable of reducing current consumption caused by an unnecessary toggling of a DLL clock signal and to provide a semiconductor memory device having the same.

In accordance with an aspect of the present invention, there is provided a semiconductor device having a register controlled delay locked loop (DLL) and an internal circuit synchronized with a DLL clock signal outputted from the register controlled DLL, the semiconductor device comprising: an enable signal generator for generating an enable signal of the register controlled DLL to control a generation of the DLL clock signal in response to an activation or nonactivation signal of the semiconductor device.

In accordance with another aspect of the present invention, there is provided a register controlled delay locked loop (DLL) in a semiconductor device comprising: an internal clock generator for generating an internal clock signal synchronized with an edge of an external clock signal, a delayed clock signal and a reference clock signal; a first delay unit for compensating an amount of delay caused by a signal transmission path of the delayed clock signal; a phase comparing unit for detecting a difference between the reference clock signal and the delayed clock signal; a controller having a plurality of second delay units for controlling an amount of delay of the delayed clock signal in response to the detection signal from the phase comparing unit; a driver for driving a DLL clock signal from the delayed clock signal of which the delay amount is controlled by the controller; an enable signal generating unit for generating an enable signal in response to an activation or non-activation signal of the semiconductor device; and a clock controller disposed between the internal clock generator and the second delay unit(s), for selectively transferring the internal clock signal from the internal clock generator to the second delay unit in response to the enable signal from the enable signal generating unit.

In accordance with still another aspect of the present invention, there is provided a register controlled delay locked loop (DLL) in a semiconductor device comprising: an internal clock generating unit for generating an internal clock signal synchronized with an edge of an external clock signal, a delayed clock signal and a reference clock signal; a first delay unit for compensating an amount of delay caused by a signal transmission path of the delayed clock signal; a phase comparing unit for detecting a difference between the reference clock signal and the delayed clock signal; a control unit having a plurality of second delay units for controlling an amount of delay of the delayed clock signal in response to the detection signal from the phase comparing unit; a driving unit for driving a DLL clock signal from the delayed clock signal of which the delay amount is controlled by the control unit; and an enable signal generating unit for enabling the driving unit in response to an activation or non-activation signal of the semiconductor device.

In accordance with still another aspect of the present invention, there is provided a register controlled delay locked loop (DLL) in a semiconductor device, wherein the register controlled DLL has delay paths, which generates internal clock signals synchronized with each edge of an external clock signal, and a feedback loop for controlling an amount of delay of the internal clock signals based on a register, the register controlled DLL comprising: a switching unit for controlling a transfer of the internal clock signals on the delay paths; and a control unit for selectively turning on the switching unit in response to an activation or non-activation signal of the semiconductor device.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DETAILED DESCRIPTION OF THE PREFERRED EMBODIMENTS

Hereinafter, a register controlled DLL in DDR SDRAM devices according to the present invention will be described in detail in reference with the accompanying drawings. A "unit" in the present invention is not necessarily a single entity, but can be composed of multiple components.

Figure 1:
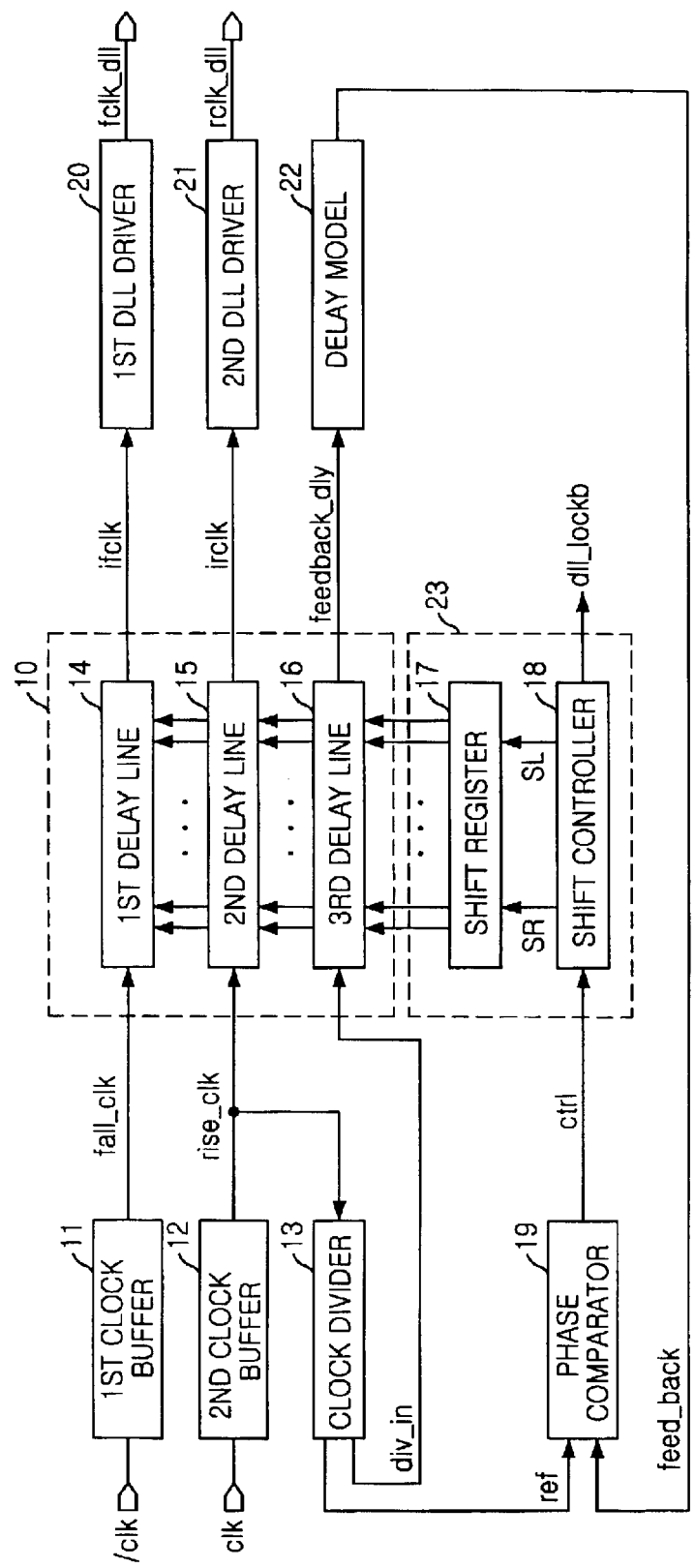
FIG. 1 is a block diagram illustrating a register controlled DLL of a conventional DDR SDRAM.
Figure 2:
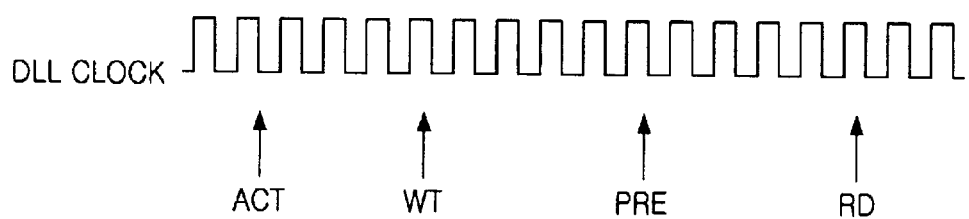
FIG. 2 is a timing chart showing a DLL clock waveform in FIG. 1.
Figure 3:
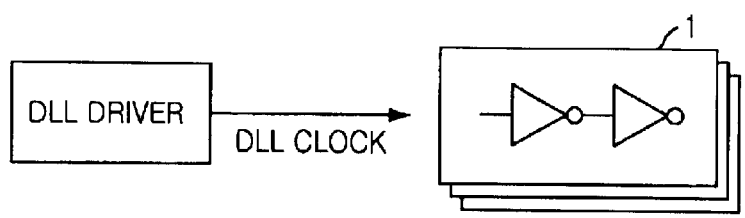
FIG. 3 is a repeater disposed in a peripheral circuit of the conventional DDR SDRAM.
Figure 4:
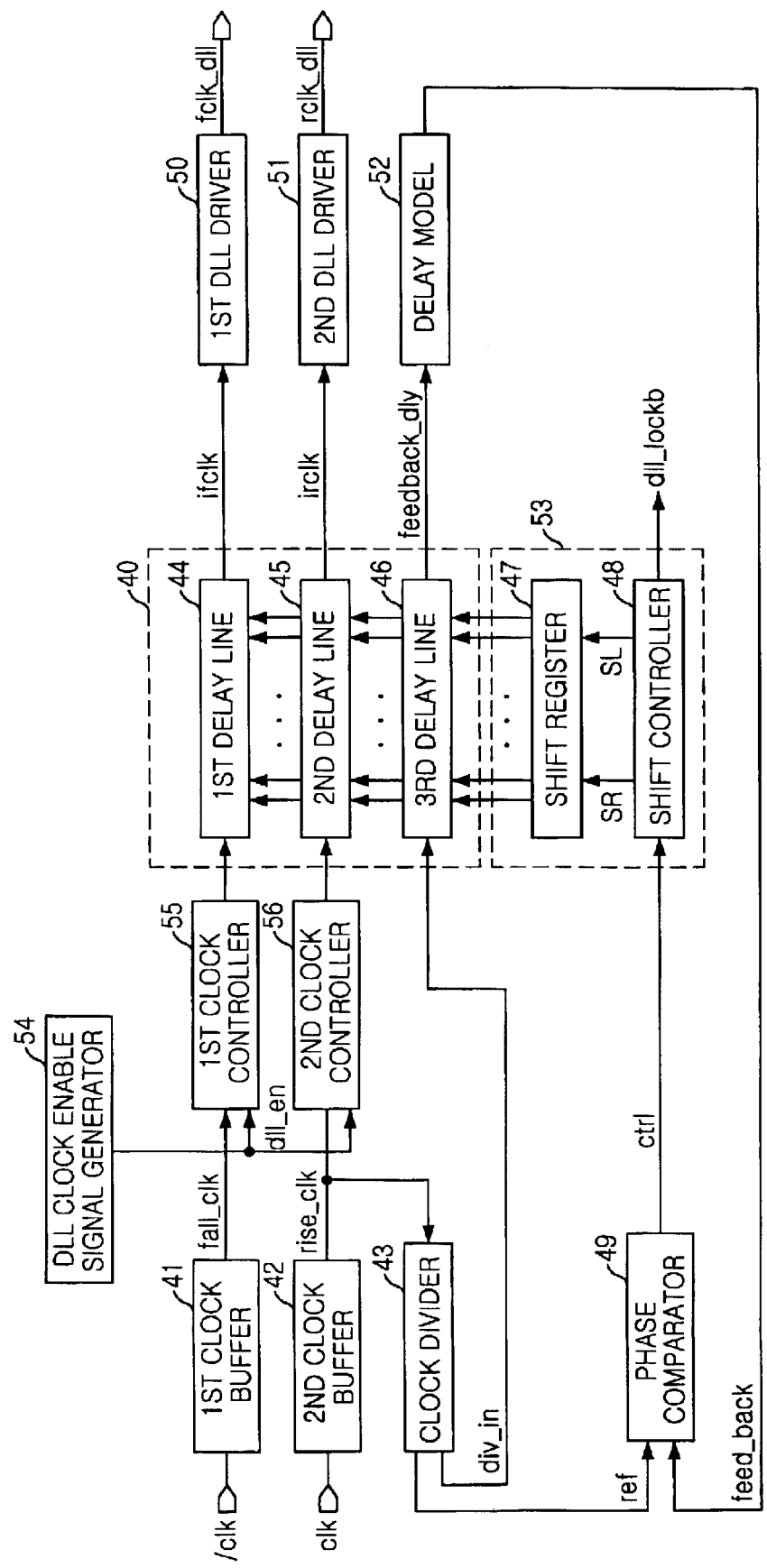
FIG. 4 is a block diagram illustrating a register controlled DLL of a DDR SDRAM in accordance with an embodiment of the present invention.

Referring to FIG. 4, the register control DLL according to an embodiment of the present invention includes first and second clock buffers 41 and 42, a clock divider 43, a phase comparator 49, a delay unit 40 which has first to third delay lines 44 to 46, a delay monitor 53 having a shift register 47 and a shift controller 48 in a DLL loop, first and second DLL drivers 50 and 51, and a delay model 52, all operatively coupled. The register control DLL shown in FIG. 4 has the same configuration as the DLL shown in FIG. 1, except for the addition of a DLL clock enable signal generator 54, first and second clock controllers 55 and 56 and connections resulting therefrom. Accordingly, the detailed description of each block in FIG. 4 will be omitted except for the DLL clock enable signal generator 54 and first and second clock controllers 55 and 56.

The first clock controller 55 is provided between the first clock buffer 41 and the first delay line 44, and the second clock controller 56 is provided between the second clock buffer 42 and the second delay line 45. Furthermore, the DLL clock enable signal generator 54 generates a DLL clock enable signal dll_en to enable the first and second clock controllers 55 and 56 and outputs the enable signal dll_en to each of the first and second clock controllers 55 and 56. In an embodiment of the present invention, when the DLL clock enable signal dll_en from the DLL clock enable signal generator 54 is at a high voltage level, the first and second clock controllers 55 and 56 are enabled.

The first clock signal fall_clk from the first clock buffer 41 and the second clock signal rise_clk from the second clock buffer 42 are transferred to the first and second delay lines 44 and 45, respectively, when the DLL clock enable signal dll_en is produced by the DLL clock enable signal generator 54. Such a selective signal transfer operation can prevent selectively the unnecessary toggling operation in the DLL clock signal according to the present invention.

Figure 5:
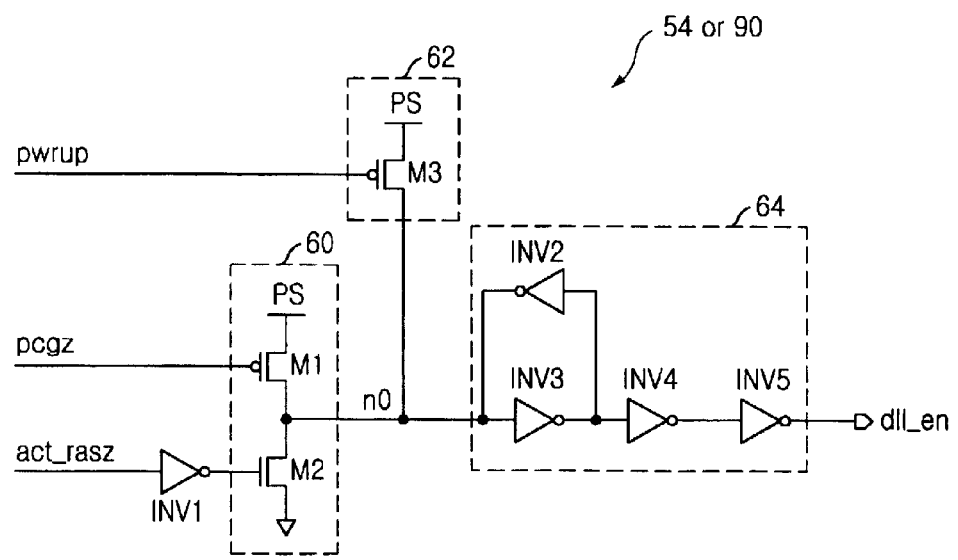
FIG. 5 is a block diagram illustrating an example of the DLL clock enable signal generator in FIG. 4.

FIG. 5 is a block diagram illustrating an example of the DLL clock enable signal generator 54 in FIG. 4 according to an embodiment of the present invention. As shown in FIG. 5, the DLL clock enable signal generator 54 includes a driving unit 60, a reset unit 62 and an output unit 64, all operatively coupled. The driving unit 60 includes a pull-up PMOS transistor M1 which increases the voltage level at node n0 in response to a precharge pulse pcgz and a pull-down NMOS transistor M2 which decreases the voltage level at the output node n0 in response to an inverted form of a row address strobe activation pulse act_rasz inverted through an inverter INV1. The pull-up PMOS transistor M1 is coupled between a power supply PS and the output node (n0) and the pull-down NMOS transistor M2 is coupled between the output node (n0) and a ground voltage level of a semiconductor memory device. The row address strobe activation pulse act_rasz is a signal that is generated when one of a plurality of banks (i.e., memory banks) is activated, and the precharge pulse pcgz is generated when precharging of all the banks is required.

The reset unit 62 coupled between a power supply PS and node n0 resets the output node (n0), by turning the voltage level of the output node (n0) high in response to a power-up signal pwrup. The output unit 64 includes an inverting latch having two inverters INV2 and INV3, and a buffer having two inverters INV4 and INV5, thereby generating and outputting a stably inverted signal of the output signal at node n0 as the DLL clock enable signal dll_en.

Figure 6A:
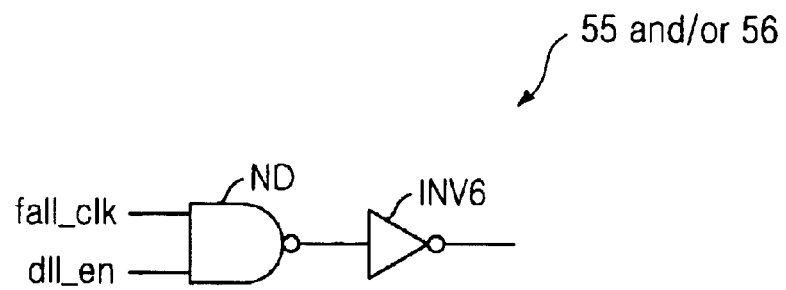
FIGS. 6A and 6B illustrate two different examples of each of first and second clock controllers in FIG. 4 according to different embodiments of the present invention.

Referring to FIG. 6A, the first clock controller 55 according to one embodiment of the present invention includes an NAND gate ND receiving the first clock signal fall_clk and the DLL clock enable signal dll_en and an inverter INV6 inverting the output signal from the NAND gate ND. The second clock controller 56 is made of the same configuration as the first clock controller 55, except that it receives the second clock signal rise_clk in lieu of the first clock signal fall_clk.

Figure 6B:
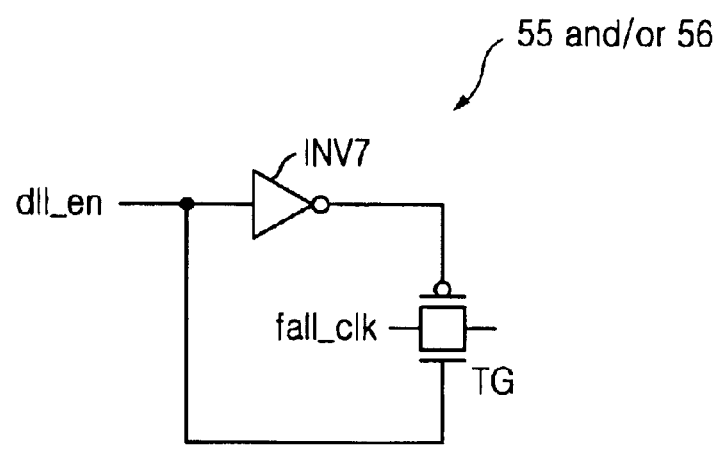

A different example of the structure of the first and second clock controllers 55 and 56 is shown in FIG. 6B in accordance with another embodiment. In FIG. 6B, the DLL clock enable signal dll_en functions as a switching control signal to control a transfer transistor TG passing the first or second clock signal fall_clk or rise_clk. While the structure of the first and second clock controllers 55 and 56 is designed based on the high voltage level of the DLL clock enable signal dll_en, it is possible to employ the different logic designs to selectively transfer the first or second clock signal fall_clk or rise_clk under the control of the DLL clock enable signal dll_en. Also, it is possible for the first and second clock controllers 55 and 56 to have the circuitry as shown in FIGS. 6A and 6B, respectively, or FIGS. 6B and 6A, respectively.

Figure 7:
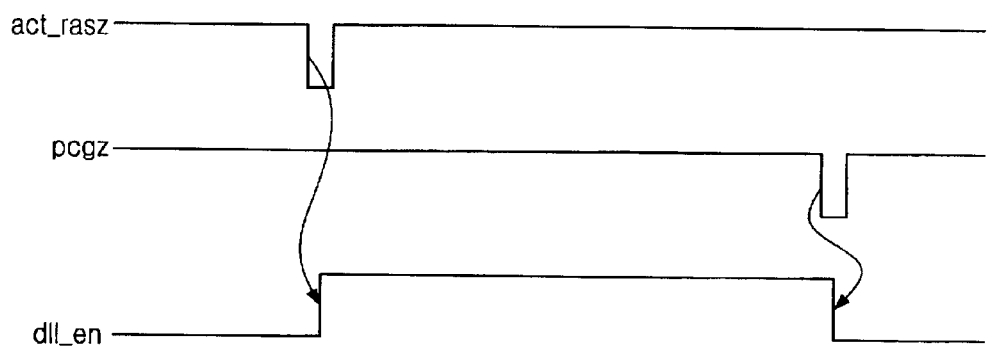
FIG. 7 is an example of a timing chart of input/output signals of the DLL clock enable signal generator in FIG. 5.

Referring to FIGS. 5 and 7, when the power-up signal pwrup of a low voltage level is applied to the DDR SDRAM, the PMOS transistor M3 is turned on and node n0 is precharged to a high voltage level, thereby outputting the DLL clock enable signal dll_en having a low voltage level. Thereafter, when the power-up signal pwrup switches from the low voltage level to a high voltage level, the latch circuit including the inverters INV2 and INV3 continuously outputs the latched value while the DLL clock enable signal dll_en is maintained at a low voltage level. When a bank active command is inputted to the DDR SDRAM and the row address strobe activation pulse act_rasz is activated to a low level (FIG. 7), the pull-down NMOS transistor M2 is turned on. Then the voltage at node n0 is discharged and the DLL clock enable signal dll_en is activated to a high voltage level.

When the row address strobe activation pulse act_rasz switches from the low voltage level to a high voltage level, the value stored in the latch circuit (INV2 and INV3) of the output unit 64 is continuously outputted as the high voltage level of the DLL clock enable signal dll_en. If a read or write command is inputted to the DDR SDRAM, the read or write operation is carried out in synchronization with the DLL clock signal.

On the other hand, after the accessing of the memory device is finished, a non-active command (i.e., a precharge command) is applied to the memory device and a bit line precharge operation is performed. At this time, the precharge pulse pcgz is activated or switched to a low voltage level as shown in FIG. 7 and then the voltage at node n0 is charged to a high voltage level due to the pull-up PMOS transistor M1. As a result, the value latched in the output unit 64 is a low voltage level value and the DLL clock enable signals dll_en switches to a low voltage level. While the precharge pulse pcgz switches from the low voltage level to a high voltage level, the value latched in the output unit 64 is maintained at the low voltage level so that the DLL clock enable signal dll_en is at the low voltage level of non-activation. That is, as shown in FIG. 7, the DLL clock enable signal dll_en is activated to a high voltage level between the activation command and non-activation command of the memory device. Thus, the bank activation command (bank selection signal) generates a DLL clock signal in response to the DLL clock enable signal dll_en and the cell bit line precharge signal.

Figure 8:
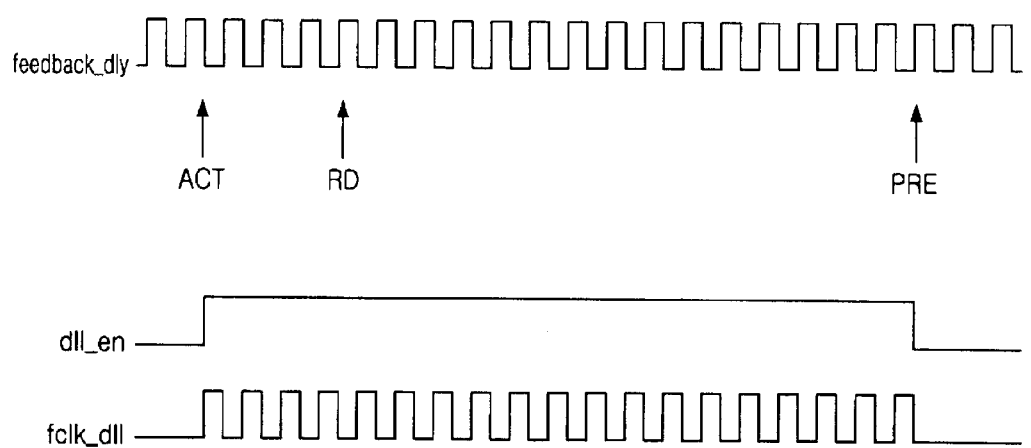
FIG. 8 is an example of a timing chart of the register controlled DLL of the DDR SDRAM in FIG. 4.

Referring to FIG. 8, the DLL loop including the clock divider 43, the phase comparator 49, the shift controller 48, the shift register 47 and the delay model 52 continuously operates, irregardless of the activation of the DLL clock enable signal dll_en, and outputs the delay controlled clock signal feedback_dly.

When the memory is in a non-activation state in which the read and write operations are not carried out, since the DLL clock enable signal dll_en is not activated, the transmission of the first and second clock signals fall_clk and rise_clk are blocked by the first and second clock controllers 55 and 56 and thus, the outputs of the first and second DLL drivers 50 and 51 are restricted.

On the other hand, if an activation signal act is inputted to the memory, the DLL clock enable signal dll_en is activated (i.e., switched to a high voltage level) and the first and second clock controllers 55 and 56 transmit therethrough the first and second clock signals fall_clk and rise_clk, respectively. Accordingly, the first and second DLL drivers 50 and 51 output the first and second DLL clock signals fclk_dll and rclk_dll, respectively, and the memory read or write operation is carried out. When the accessing of the memory device has been completed and a precharge command is applied to the memory, the DLL clock enable signal dll_en from the DLL clock enable signal generator 54 is not activated so that the transmission of the first and second clock signals fall_clk and rise_clk are blocked by the first and second clock controllers 55 and 56 in response to the non-activation of the DLL clock enable signal dll_en.

Since the DLL clock signal of the DDR SDRAM memory according to the present invention is activated between the activation command and the non-activation command of the memory, the DLL clock signal is not generated for an undesired period of the non-activation of the memory, thereby reducing power consumption by the memory. Further, since the first and second clock controllers 55 and 56 do not transmit the first and second clock signals fall_clk and rise_clk therethrough, then the amount of current consumed by the first and second delay lines 44 and 45 is reduced significantly.

Figure 9:
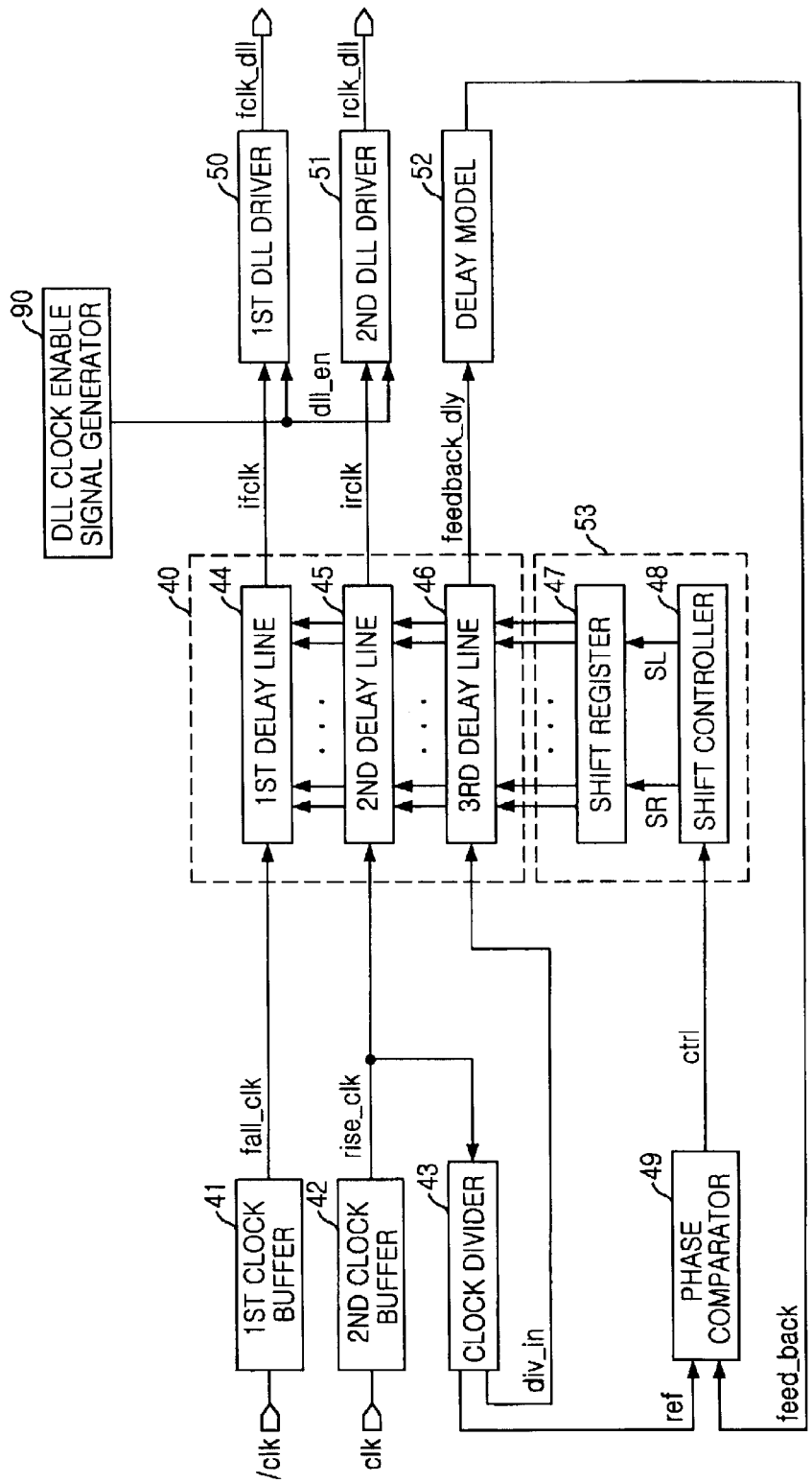
FIG. 9 is a block diagram illustrating a register controlled DLL of a DDR SDRAM in accordance with another embodiment of the present invention.

The DLL clock enable signal generator 54 may be coupled to different elements which are disposed on the delay path in DLL clock generating circuits, by generating an enable signal to control the different elements on the delay path. FIG. 9 is a block diagram illustrating a register controlled DLL of a DDR SDRAM in accordance with another embodiment of the present invention.

According to another embodiment of the present invention, a DLL clock enable signal generator 90 is coupled to the first and second DLL drivers 50 and 51 so that the DLL clock enable signal generator 90 enables or disables the first and second DLL drivers 50 and 51 without the use of the clock controllers 55 and 56 shown in FIG. 4.

In this embodiment, the first and second DLL drivers 50 and 51 may be composed of a conventional output driver having a pull-up device and a pull-down device, respectively. Accordingly, an additional switch is controlled by the enable signal from the DLL clock enable signal generator 90 and by-passes an output voltage at its output node to a ground voltage level of the memory device through the switching operation while the memory device is not activated. Thus, the current reduction according to the present invention can be easily achieved.

The operation of each element shown in FIG. 9 is the same as that shown in FIG. 8. That is, when the read or write operation is not carried out, the DLL clock enable signal dll_en is not activated and is maintained at a low voltage level so that first and second DLL drivers 50 and 51 are disabled to restrict the output of the first and second clock signals fclk_dll and rclk_dll. If the memory device is activated to perform the read or write operation, the DLL clock enable signal dll_en is activated to a high voltage level and then the first and second DLL drivers 50 and 51 are enabled to output of the first and second clock signals fclk_dll and rclk_dll.

As compared with the DLL clock enable signal generator 54 in FIG. 4, the DLL clock enable signal generator 90 in FIG. 9 may not reduce the amount of current consumed in the delayers (the delay lines 44 and 45) significantly, but will reduce the amount of current consumed by the undesired toggling of the DLL clock.

The present invention can be achieved at an input terminal of a peripheral circuit of the memory device. For example, if the DLL clock enable signal generator and a clock controller (which performs the function as shown in FIG. 4) are provided to an input terminal of a peripheral circuit of the memory device, the clock controller may be employed in order to enable and disable it in response to the output signal from the DLL clock enable signal generator. In this case, the amount of current consumed in repeaters of the peripheral circuit can be remarkably reduced.

Particularly, in one embodiment of the present invention, the DLL clock may be controlled and toggled only when a read operation is performed. In a memory device which performs the DLL operation only at the time of the read operation, the DLL clock enable signal generator produces the DLL clock enable signal only for such an operation timing. That is, if the DLL clock enable signal is produced via the shortest read command path, it is not produced when a burst operation has been finished, and the memory device operates in different modes other than the read operation where the memory device may perform the DLL operation only at the time of the read operation. In this case, the DLL clock enable signal generator in FIG. 5 may input a read command signal (Rdb) to the inverter INV1, instead of the row address strobe activation pulse act_rasz which is inputted to the inverter INV1. In one example, the read command signal Rdb is a low active signal which is produced by combing output signals from command buffers. Accordingly, in this case, the DLL clock disable signal has to be designed by considering the time it takes for the data to pass through the data output buffer, and the activation of the DLL clock enable signal dll_en has to be guaranteed while the read operation is carried out, even if any other signals are inputted to the memory device. These teachings may be applicable to the configuration shown in FIGS. 6A and/or 6B.

As apparent from the above, the undesired current consumption is prevented by selectively enabling the DLL clock signals during the read or write operations of the memory device.

Although the preferred embodiments of the invention have been disclosed for illustrative purposes, those skilled in the art will appreciate that various modifications, additions and substitutions are possible, without departing from the scope and spirit of the invention as disclosed in the accompanying claims. For example, the present invention is illustrated in the DDR SDRAM, but it is equally applicable to any other synchronization memory device or logic circuits. In another example, a low voltage level can be designated to represent an activation of a signal. Although the embodiments of the present invention employ the row address strobe activation plus or read command signal as an activation signal, and the precharge plus as an non-activation signal, different signals (e.g., a column address strobe signal, a write enable signal or an activation command) can be used as the activation signal. Also, different signals can be used as the non-activation signals, which are not related to the data input and output. Furthermore, the components of one embodiment of the present invention can be used as a substitute for or an addition to the components of another embodiment of the present invention.

What is claimed is:

1. A semiconductor device having a register controlled delay locked loop (DLL) and an internal circuit synchronized with a DLL clock signal outputted from the register controlled DLL, the semiconductor device comprising:

an enable signal generator generating an enable signal for the register controlled DLL to control a generation of the DLL clock signal in response to an activation or non-activation signal of the semiconductor device.

2. The semiconductor device as recited in claim 1, further comprising:

a control unit switching a signal transmission path to selectively transfer its input clock signal in response to the enable signal.

3. The semiconductor device as recited in claim 2, wherein the control unit includes a NAND gate and an inverter.

4. The semiconductor device as recited in claim 2, wherein the control unit includes a transfer transistor and an inverter.

5. The semiconductor device as recited in claim 1, wherein the enable signal generator includes:

a driving unit carrying out a pull-up or pull-down operation in response to the activation or non-activation signal of the semiconductor device;

a reset unit resetting an output node of the driving unit; and a latch and buffering unit latching and buffering an output signal from the output node.

6. The semiconductor device as recited in claim 5, wherein the activation signal is one of following:

an activation command signal, a write enable signal, a read command signal, a column address strobe command signal, and a row address strobe command signal.

7. The semiconductor device as recited in claim 5, wherein the non-activation signal is a precharge signal for precharging a bit line of a memory cell in the semiconductor device.

8. A register controlled delay locked loop (DLL) usable in a semiconductor device, the register controlled delay locked loop comprising:

an internal clock generating unit generating an internal clock signal associated with an external clock signal, and generating a delayed clock signal and a reference clock signal;

a first delay unit compensating for an amount of delay caused by a signal transmission path of the delayed clock signal;

a phase comparator detecting a difference between the reference clock signal and the delayed clock signal and thereby generating a detection signal;

a controller having a plurality of second delay units for controlling an amount of delay of the delayed clock signal in response to the detection signal from the phase comparator;

a driver driving a DLL clock signal from the delayed clock signal having its delay amount controlled by the controller;

an enable signal generator generating an enable signal in response to an activation or non-activation signal of the semiconductor device; and a clock control unit disposed between the internal clock generating unit and at least one of the second delay units, for selectively transferring the internal clock signal from the internal clock generating unit to the second delay unit in response to the enable signal.

9. The register controlled delay locked loop as recited in claim 8, wherein the enable signal generator includes:

a driving unit carrying out a pull-up or pull-down operation in response to the activation or non-activation signal of the semiconductor device;

a reset unit resetting an output node of the driving unit; and a latch and buffering unit latching and buffering an output from the output node.

10. The register controlled delay locked loop as recited in claim 8, wherein the clock control unit includes a logic gate circuit passing the internal clock signal in response to an output signal from the enable signal generator.

11. The register controlled delay locked loop as recited in claim 8, wherein the clock control unit includes a switching transfer gate to transfer the internal clock signal in response to both an output signal from the enable signal generator and an inverted signal of the output signal from the enable signal generator.

* * * * *